US012757540B2

(12) United States Patent
Monestier et al.

(10) Patent No.: US 12,757,540 B2
(45) Date of Patent: Oct. 6, 2026

(54) LED WITH SEGMENTED SEMICONDUCTOR STRUCTURE

(71) Applicant: Lumileds LLC, San Jose, CA (US)

(72) Inventors: Florent Monestier, Kerkrade (NL); Peter Josef Schmidt, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 367 days.

(21) Appl. No.: 18/514,891

(22) Filed: Nov. 20, 2023

(65) Prior Publication Data

US 2025/0169247 A1 May 22, 2025

(51) Int. Cl.
*H10H 20/851* (2025.01)
*H10H 20/01* (2025.01)
*H10H 20/814* (2025.01)

(52) U.S. Cl.
CPC ...... *H10H 20/8512* (2025.01); *H10H 20/013* (2025.01); *H10H 20/814* (2025.01)

(58) Field of Classification Search
CPC . H10H 20/8512; H10H 20/013; H10H 20/814
See application file for complete search history.

(56) References Cited

U.S. PATENT DOCUMENTS

2014/0138722 A1* 5/2014 Yamada ............... H10H 20/831 257/98
2020/0144327 A1* 5/2020 Lee ...................... H10H 29/142
2020/0357846 A1 11/2020 Lee et al.
2022/0293667 A1 9/2022 Lopez et al.

FOREIGN PATENT DOCUMENTS

EP 3399554 A1 3/2018
WO 2023/022791 A1 2/2023

OTHER PUBLICATIONS

From the EPO as the ISA, "Notification of Transmittal of the International Search Report and the Written Opinion of the International Searching Authority, or the Declaration", PCT/US2024/053098, Feb. 7, 2025, 11 pages.

* cited by examiner

*Primary Examiner* — Errol V Fernandes

(57) ABSTRACT

A compact LED package has a segmented semiconductor structure that may emit light and at least two wavelength converting structures absorbing the emitted light to emit their own light. One of the wavelength converting structures may emit infrared (IR) or near-infrared (NIR) light, e.g., for IR sensing functions, while the other may emit visible light. The wavelength converting structures may be ceramic platelets coupled to each other. The segments of the semiconductor structure may be individually addressable, and the segmented semiconductor structure may allow for a reduction of package size compared to conventional LED packages.

20 Claims, 11 Drawing Sheets

LED WITH SEGMENTED SEMICONDUCTOR STRUCTURE

FIELD OF THE INVENTION

The invention relates generally to LED packages, LED packages with a segmented semiconductor structure and at least two wavelength converter structures.

BACKGROUND

The automotive and general illumination industry has witnessed remarkable advancements in technology, with one breakthrough being the invention of Light-Emitting Diodes (LEDs). This innovation has transformed the way we perceive and experience automotive lighting and general illumination, offering improved efficiency, durability, and versatility. Developed as a response to the limitations of traditional light source, automotive LEDs have become a staple feature in modern vehicles, providing enhanced safety, aesthetics, and functionality. These LEDs may be placed into a compact illumination package to save on volume.

Adding infrared (IR) sensing functions to these compact illumination package can provide lots of value, particularly in the present landscape where more and more IR sensing functions interact together in smaller and smaller device package. One of the main advantage of incorporating IR sensing function directly in illumination package is the ability to keep the device package size as small as possible to save space and avoid using different optics. Combining visible light emission and IR sensing avoids having to interconnect a separate emitter. The same secondary optics can be used for both illumination and source of IR sensing function. Size constraint is particularly critical in mobile or wearable devices.

The main challenge to combining visible color emitters (e.g., white color emitters) for illumination with an IR emitter for sensing function is to not compromise the efficacy of each source, provide enough emitted power for both illumination and IR sensing. However, the conventional way to combine IR and white emitter is simply to combine two different sources on the same board. Moreover, the IR emitter is often only a mid-power emitter made of a powder phosphor converter, i.e., a thin film converter layer where phosphor particles are densely packed in a thin matrix. However, it is difficult to combine on one substrate an IR converter made from powder with high power white emitter, as the white emitter typically requires a platelet ceramic converter for good thermal management.

Furthermore, not having enough IR power for sensing is a critical issue, as additional electronics component like electronic amplifiers will be needed to increase the measured signal/noise ratio. As a consequence, it will dramatically increase the cost of system, add steps to the packaging process, and enlarge the system size.

SUMMARY

According to embodiments of the invention, a compact LED package with a segmented semiconductor structure and at least two wavelength converter structures allows segments to be controlled individually from each other. For example, one of the segments may be an emitter corresponding to an IR or near-infrared (NIR) wavelength converter structure, while the other segment may be an emitter corresponding to a visible light wavelength converter, such as a yellow emitting wavelength converter. The IR/NIR wavelength converter structure may be a high power ceramic platelet coupled to the visible light wavelength converter, allowing significantly more power than a conventional IR wavelength converter structure based on powder. Additionally, using a segmented semiconductor structure rather than two separate larger emitters allows the package size to be reduced, as well as allows the ability to control each source individually, allowing minimization of cross talk between them.

Embodiments of this invention may be used in any automotive, illumination, mobile/portable detection systems where it is desirable to combine a high power visible light emitter with a high power IR emitter.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention.

As used in this specification and the appended claims, the singular forms “a,” “an,” and “the” include plural referents unless the context clearly indicates otherwise. Also, the term “parallel” is intended to mean “substantially parallel” and to encompass minor deviations from parallel geometries. The term “vertical” refers to a direction parallel to the force of the earth’s gravity. The term “horizontal” refers to a direction perpendicular to “vertical.” The term “on” means to be disposed to overlap (e.g., vertically) and/or to be directly in contact with.

Figure 1:
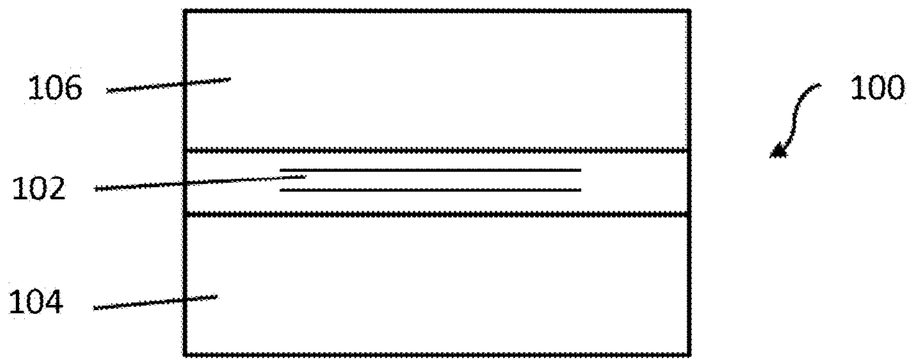
FIG. 1 shows a schematic cross-sectional view of an example pcLED.

FIG. 1 shows an example of an individual pcLED 100 comprising a light emitting semiconductor diode (LED) structure 102 disposed on a substrate 104, and a phosphor layer 106 (also referred to herein as a wavelength converting structure) disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED. Phosphor layers may for example comprise phosphor particles dispersed in or bound to each other with a binder material, or be or comprise a sintered ceramic phosphor plate.

Figure 2A:
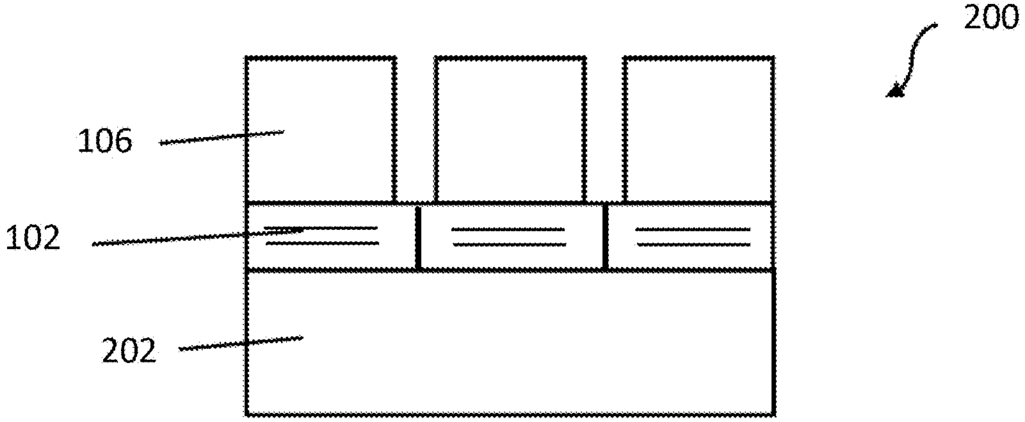
FIGS. 2A and 2B show, respectively, cross-sectional and top schematic views of an array of pcLEDs.
Figure 2B:
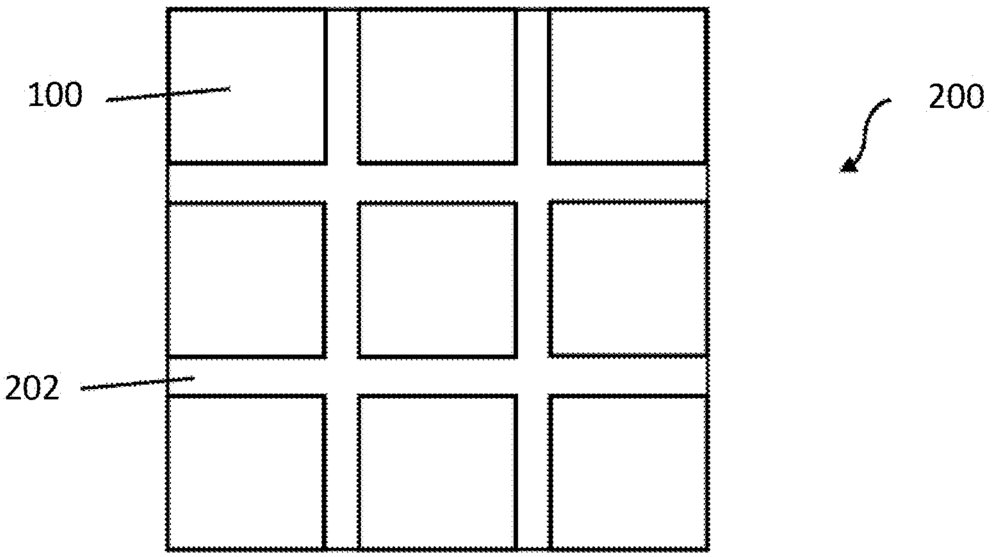

FIGS. 2A-2B show, respectively, cross-sectional and top views of an array 200 of pcLEDs 100 including phosphor layers 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from individual mechanically separate pcLEDs arranged on a substrate. Substrate 202 may optionally comprise CMOS circuitry for driving the LED and may be formed from any suitable materials.

Although FIGS. 2A-2B show a three-by-three array of nine pcLEDs, such arrays may include for example tens, hundreds, or thousands of LEDs. Individual LEDs may have widths (e.g., side lengths) in the plane of the array of, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns.

Figure 2C:
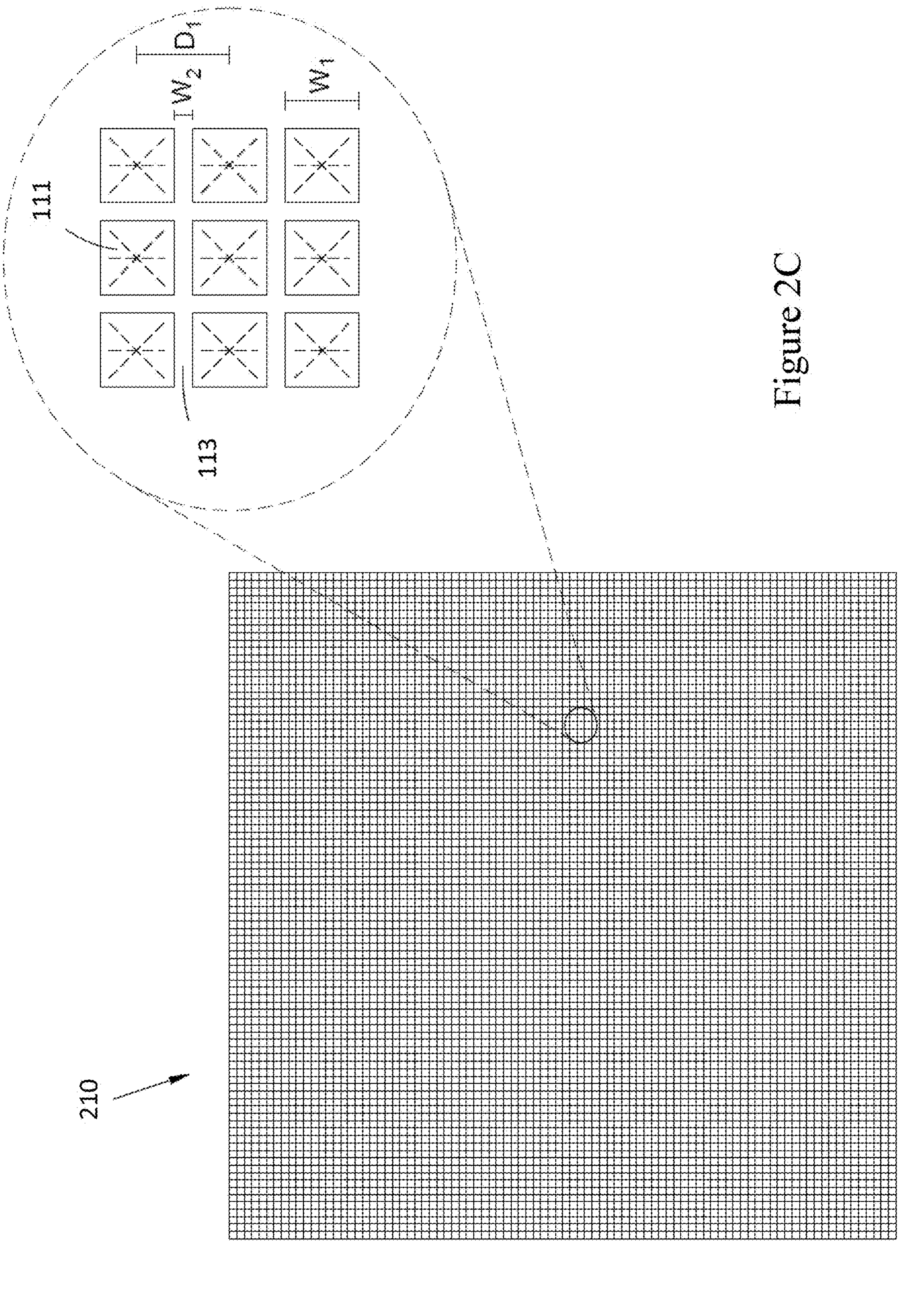

FIG. 2C shows a schematic top view of a portion of an LED wafer 210 from which LED arrays such as those illustrated in FIGS. 2A and 2B may be formed. FIG. 2C also shows an enlarged 3×3 portion of the wafer. In the example wafer individual LEDs or pcLEDs 111 having side lengths (e.g., widths) of W1 are arranged as a square matrix with neighboring LEDs or pcLEDs having a center-to-center distances D1 and separated by lanes 113 having a width W2. W1 may be, for example, less than or equal to 1 millimeter (mm), less than or equal to 500 microns, less than or equal to 100 microns, less than or equal to 50 microns, or less than or equal to 10 microns. W2 may be, for example, hundreds of microns, less than or equal to 100 microns, less than or equal to 50 microns, less than or equal to 10 microns, or less than or equal to 5 microns. D1=W1+W2.

An array may be formed, for example, by dicing wafer 210 into individual LEDs or pcLEDs and arranging the dice on a substrate. Alternatively, an array may be formed from the entire wafer 210, or by dividing wafer 210 into smaller arrays of LEDs or pcLEDs.

LEDs having dimensions in the plane of the array (e.g., side lengths) of less than or equal to about 50 microns are typically referred to as microLEDs, and an array of such microLEDs may be referred to as a microLED array.

Although the illustrated examples show rectangular LEDs or pcLEDs arranged in a symmetric matrix, the LEDs or pcLEDs and the array may have any suitable shape or arrangement and need not all be of the same shape or size. For example, LEDs or pcLEDs located in central portions of an array may be larger than those located in peripheral portions of the array. Alternatively, LEDs or pcLEDs located in central portions of an array may be smaller than those located in peripheral portions of the array.

In an array of pcLEDs, all pcLEDs may be configured to emit essentially the same spectrum of light. Alternatively, a pcLED array may be a multicolor array in which different pcLEDs in the array may be configured to emit different spectrums (colors) of light by employing different phosphor compositions. Similarly, in an array of direct emitting LEDs (i.e., not wavelength converted by phosphors) all LEDs in the array may be configured to emit essentially the same spectrum of light, or the array may be a multicolor array comprising LEDs configured to emit different colors of light.

The individual LEDs or pcLEDs in an array may be individually operable (addressable) and/or may be operable as part of a group or subset of (e.g., adjacent) LEDs or pcLEDs in the array.

An array of LEDs or pcLEDs, or portions of such an array, may be formed as a segmented monolithic structure in which individual LEDs or pcLEDs are electrically isolated from each other by trenches and/or insulating material, but the electrically isolated segments remain physically connected to each other by portions of the semiconductor structure.

An LED or pcLED array may therefore be or comprise a monolithic multicolor matrix of individually operable LED or pcLED light emitters. The LEDs or pcLEDs in the monolithic array may for example be microLEDs as described above.

A single individually operable LED or pcLED or a group of adjacent such LEDs or pcLEDs may correspond to a single pixel (picture element) in a display. For example, a group of three individually operable adjacent LEDs or pcLEDs comprising a red emitter, a blue emitter, and a green emitter may correspond to a single color-tunable pixel in a display.

Figure 3A:
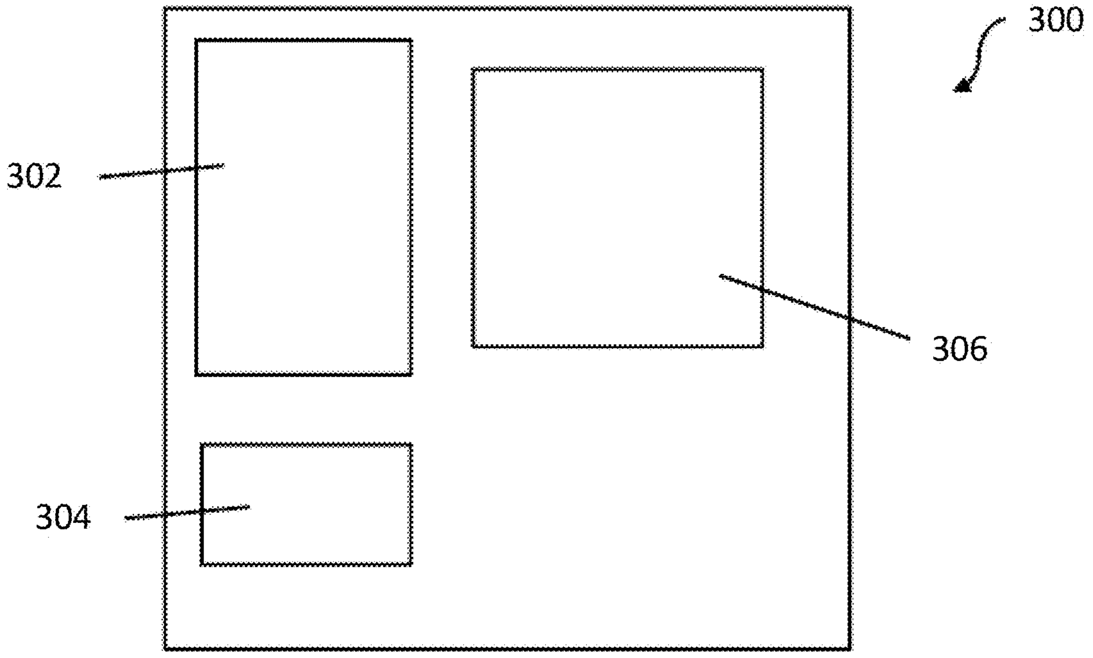
FIG. 3A shows a schematic top view of an electronics board on which an array of pcLEDs may be mounted, and FIG. 3B similarly shows an array of pcLEDs mounted on the electronic board of FIG. 3A.
Figure 3B:
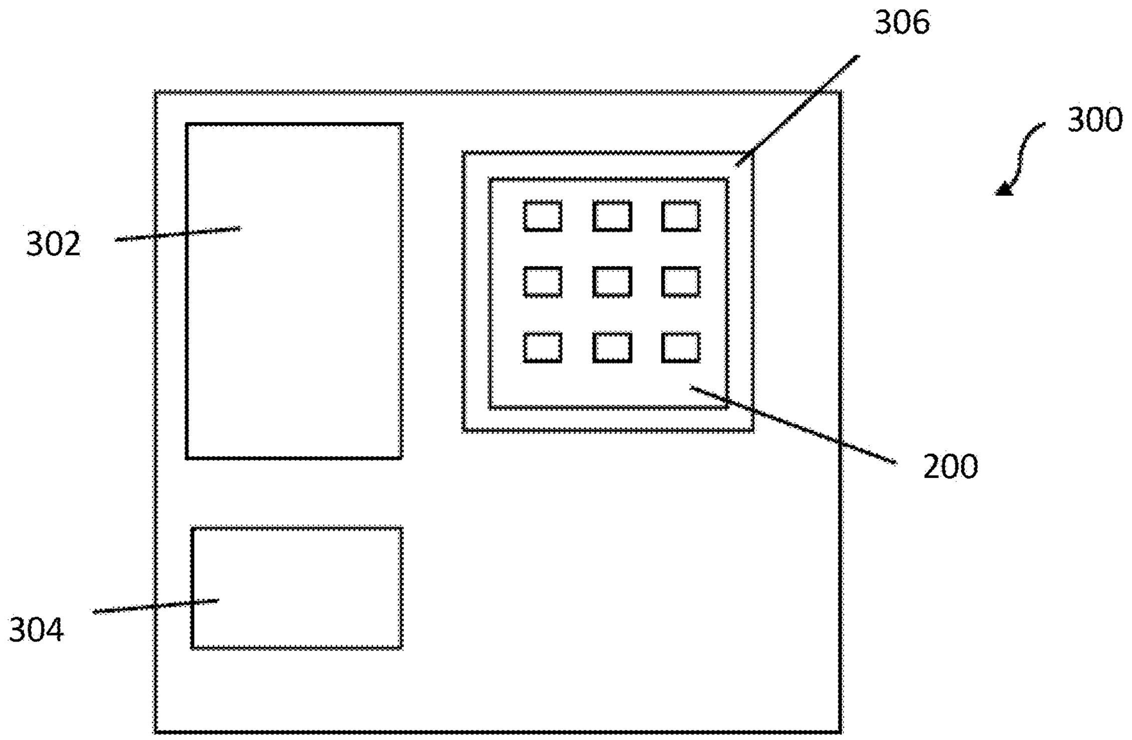

As shown in FIGS. 3A-3B, an LED or pcLED array 200 may be mounted on an electronics board 300 comprising a power and control module 302, a sensor module 304, and an attach region 306. Power and control module 302 may receive power and control signals from external sources and signals from sensor module 304, based on which power and control module 302 controls operation of the LEDs/pcLEDs. Sensor module 304 may receive signals from any suitable sensors, for example from temperature or light sensors.

Alternatively, array 200 may be mounted on a separate board (not shown) from the power and control module and the sensor module.

Figure 4A:
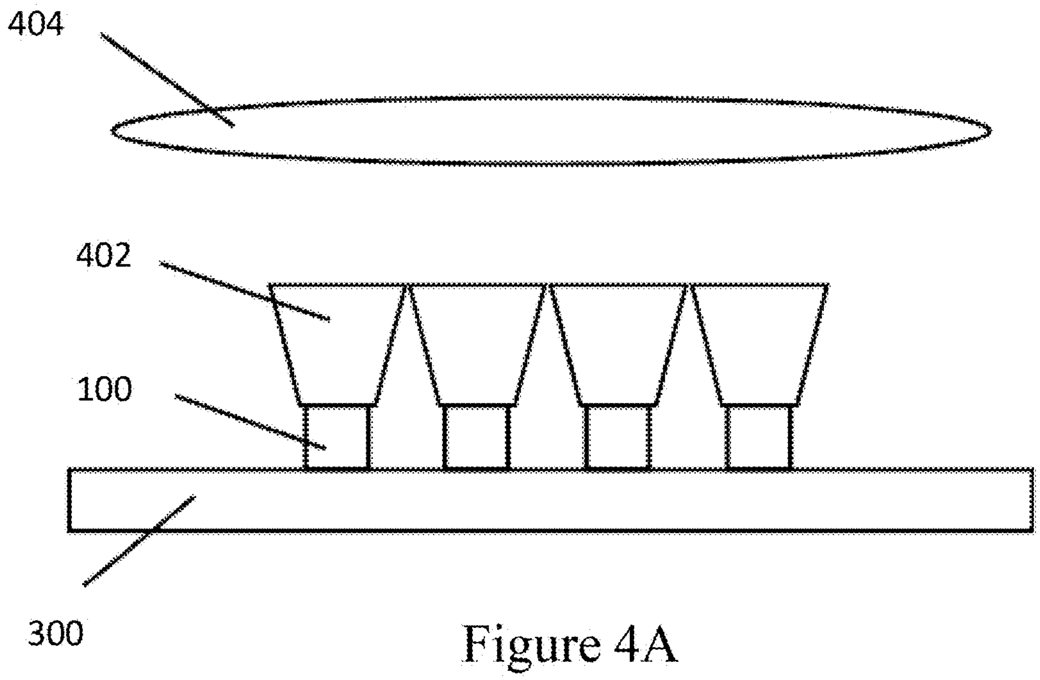
FIG. 4A shows a schematic cross-sectional view of an array of pcLEDs arranged with respect to waveguides and a projection lens.
Figure 4B:
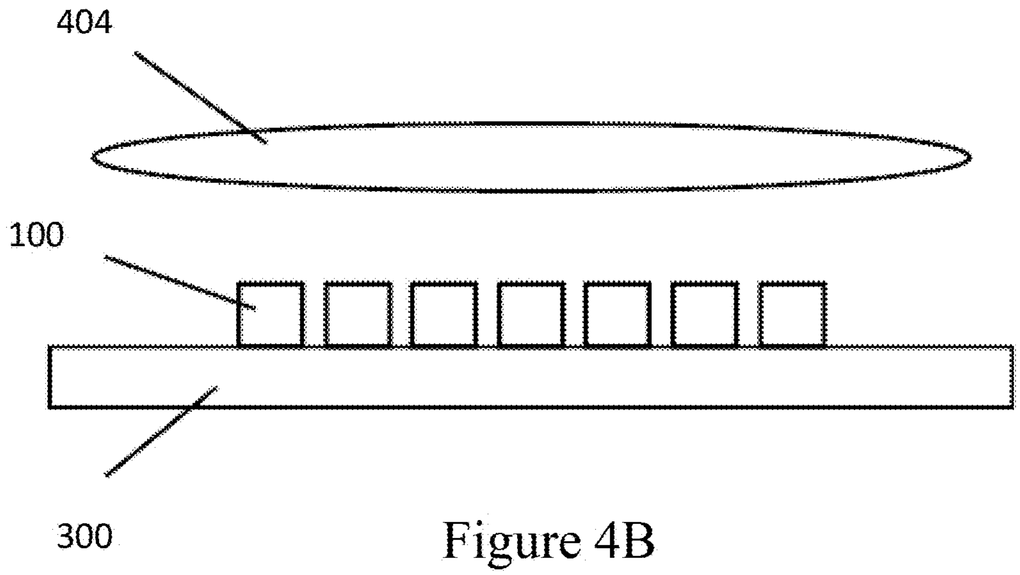
FIG. 4B shows an arrangement similar to that of FIG. 4A, without the waveguides.

Individual LEDs or pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B an array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when LEDs or pcLEDs can be spaced sufficiently close to each other and may also be used in automobile headlights as well as in camera flash applications. A microLED display application may use similar optical arrangements to those depicted in FIGS. 4A-4B, for example.

In another example arrangement, a central block of LEDs or pcLEDs in an array may be associated with a single common (shared) optic, and edge LEDs or pcLEDs located in the array at the periphery of the central bloc are each associated with a corresponding individual optic.

Generally, any suitable arrangement of optical elements may be used in combination with the LED and pcLED arrays described herein, depending on the desired application.

LED and pcLED arrays as described herein may be useful for applications requiring or benefiting from fine-grained intensity, spatial, and temporal control of light distribution. These applications may include, but are not limited to, precise special patterning of emitted light from individual LEDs or pcLEDs or from groups (e.g., blocks) of LEDs or pcLEDs. Depending on the application, emitted light may be spectrally distinct, adaptive over time, and/or environmentally responsive. Such arrays may provide pre-programmed light distribution in various intensity, spatial, or temporal patterns. The emitted light may be based at least in part on received sensor data and may be used for optical wireless communications. Associated electronics and optics may be distinct at an individual LED/pcLED, group, or device level.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), VR, and AR applications such as those described below.

Figure 5:
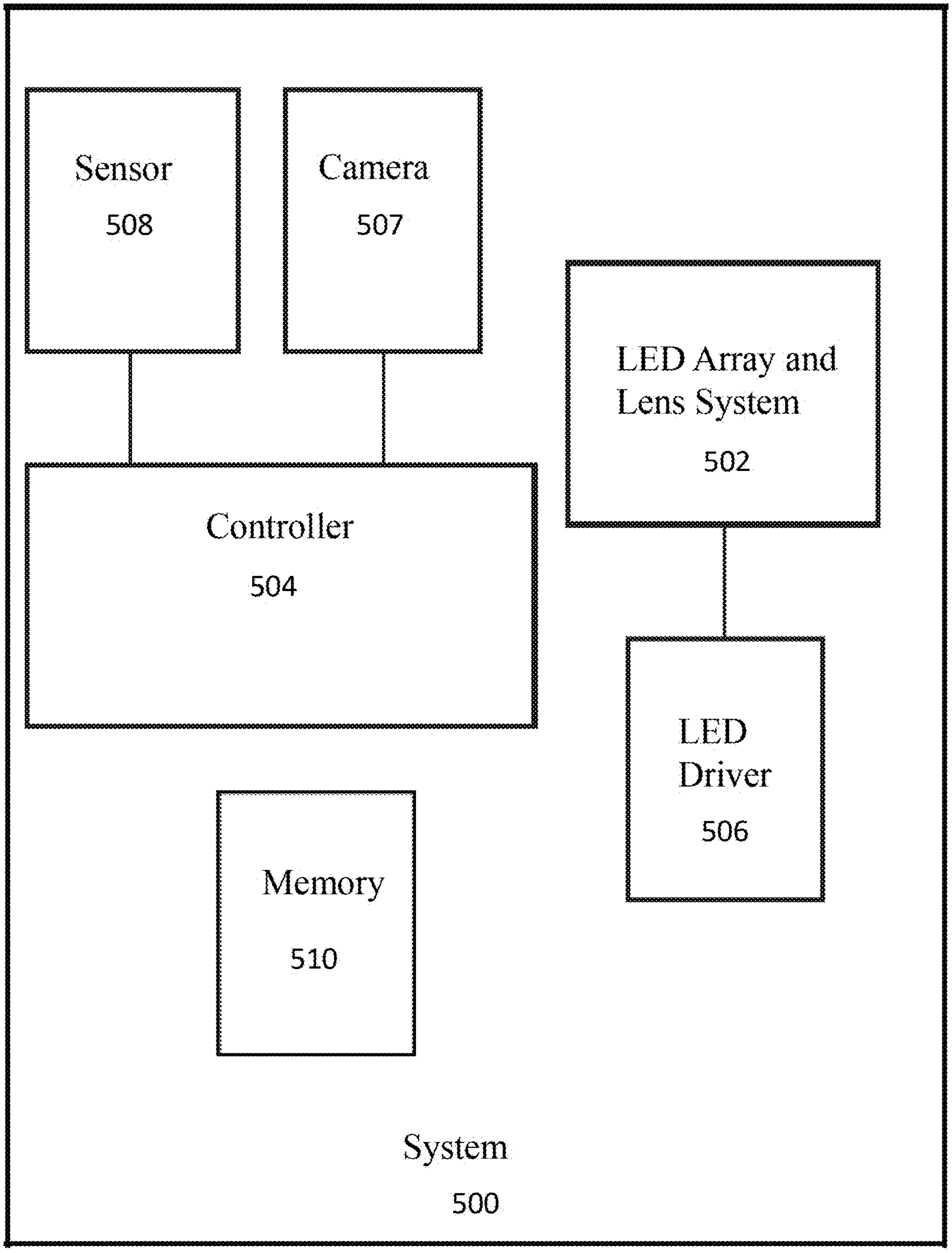
FIG. 5 schematically illustrates an example camera flash system.

FIG. 5 schematically illustrates an example camera flash system 500 comprising an LED or pcLED array and lens system 502, which may be or comprise an adaptive lighting system as described above in which LEDs or pcLEDs in the array may be individually operable. In operation of the camera flash system, illumination from some or all of the LEDs or pcLEDs in array and lens system 502 may be adjusted-deactivated, operated at full intensity, or operated at an intermediate intensity. The array may be a monolithic array, or comprise one or more monolithic arrays, as described above. The array may be a microLED array, as described above.

Flash system 500 also comprises an LED driver 506 that is controlled by a controller 504, such as a microprocessor. Controller 504 may also be coupled to a camera 507 and to sensors 508 and operate in accordance with instructions and profiles stored in memory 510. Camera 507 and LED or pcLED array and lens system 502 may be controlled by controller 504 to, for example, match the illumination provided by system 502 (i.e., the field of view of the illumination system) to the field of view of camera 507, or to otherwise adapt the illumination provided by system 502 to the scene viewed by the camera as described above. Sensors 508 may include, for example, positional sensors (e.g., a gyroscope and/or accelerometer) and/or other sensors that may be used to determine the position and orientation of system 500.

Figure 6:
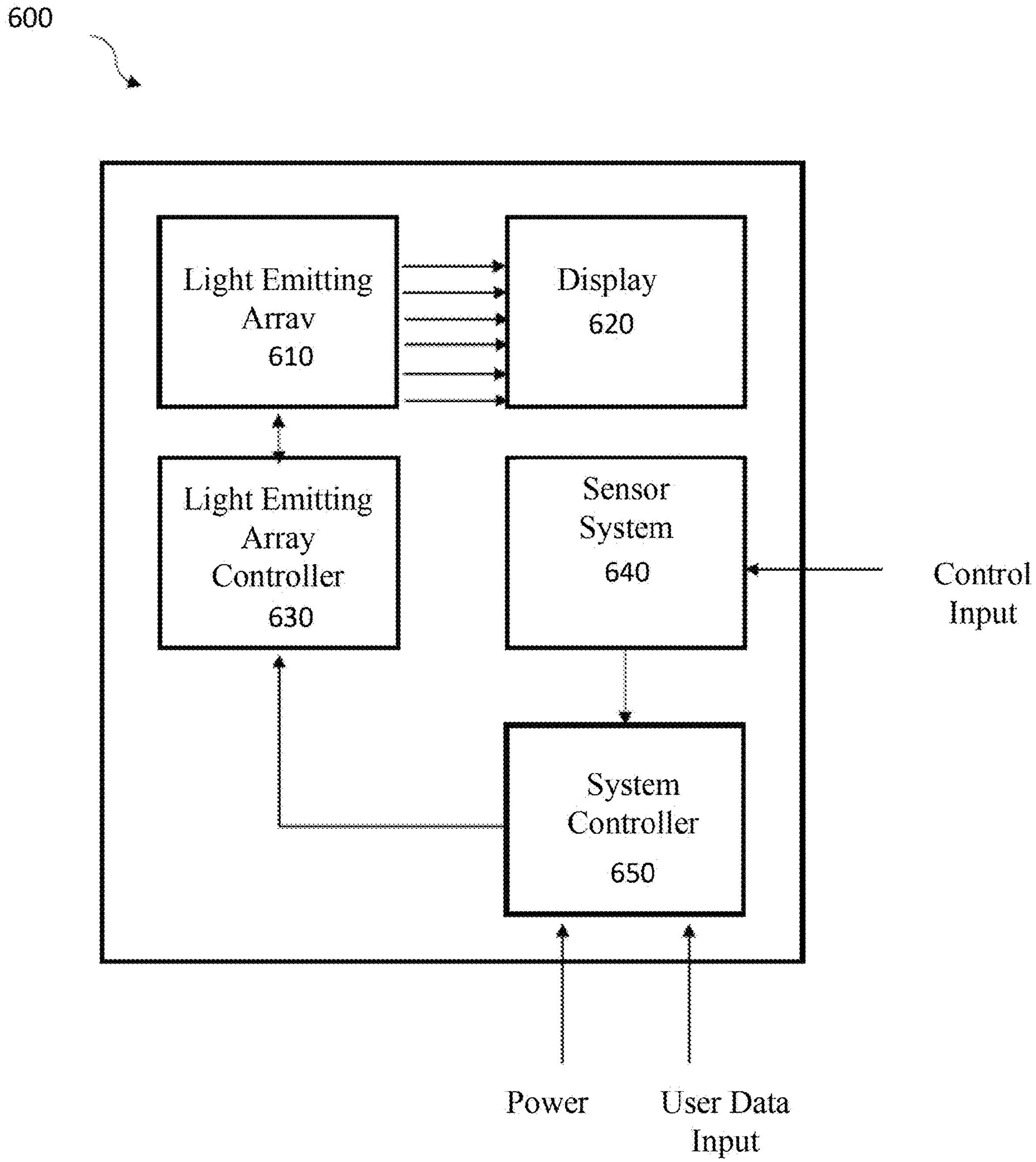
FIG. 6 schematically illustrates an example display (e.g., AR/VR/MR) system.

FIG. 6 schematically illustrates an example display (e.g., AR/VR/MR) system 600 that includes an array 610 of individually operable LEDs or pcLEDs, a display 620, a light emitting array controller 630, a sensor system 640, and a system controller 650. Array 610 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Array 610 can be used to project light in graphical or object patterns that can support AR/VR/MR systems Control input is provided to the sensor system 640, while power and user data input is provided to the system controller 650. In some embodiments modules included in system 600 can be compactly arranged in a single structure, or one or more elements can be separately mounted and connected via wireless or wired communication. For example, array 610, display 620, and sensor system 640 can be mounted on a headset or glasses, with the light emitting array controller and/or system controller 650 separately mounted.

System 600 can incorporate a wide range of optics (not shown) to couple light emitted by array 610 into display 620. Any suitable optics may be used for this purpose.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

The above LEDs utilize dies whose flux, reflectivity and optical efficiency are dependent on the geometry of the layers and elements in the die. Improving the geometry of these elements will improve the light emitting efficiency of the LEDs as a whole.

Figure 7:
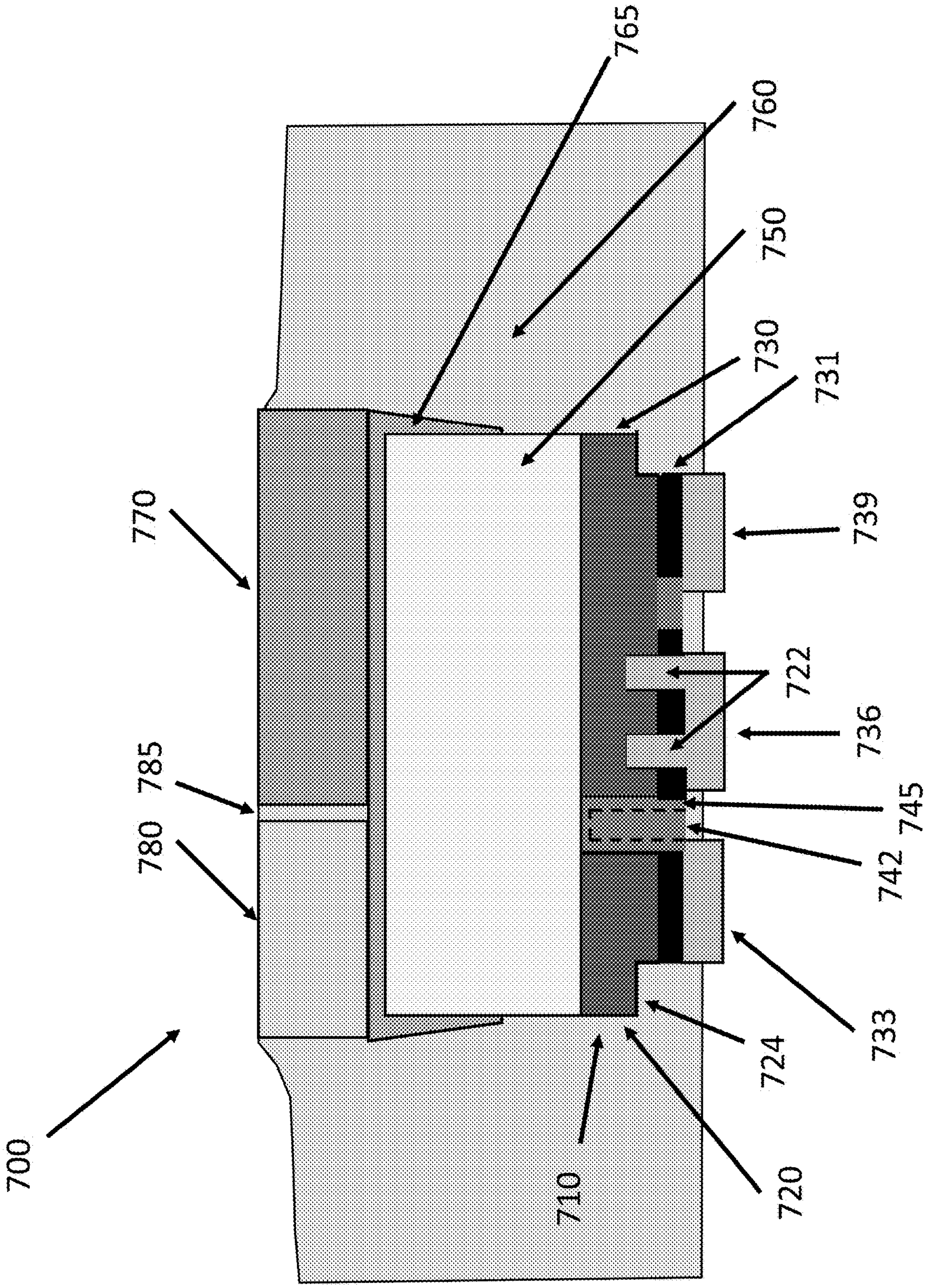
FIG. 7 shows a cross section of an LED package with a segmented semiconductor structure and two wavelength converters side by side.

FIG. 7 shows a cross-section of an LED package 700 according to embodiments of the invention. The LED package includes two individually addressable emitters etched from a monolithic semiconductor structure to be physically spaced apart from each other. For example, the LED package may have a semiconductor structure 710 including a light emitting active layer that includes a first segment 720 physically separated from the second segment 730. These segments may be coupled to each other through the substrate 750 that may be transparent (this may be a sapphire substrate). These segments may not be in direct contact with each other. The first segment 720 and second segment 730 may be individually addressable from each other as each may be in direct contact with a corresponding anode 733 and anode 739, respectively. They may share a common cathode 736 that is electrically in contact with the n-edge contact 724 surrounding the die. The first and second segments may have different areas from each other (e.g., the first segment may be smaller than the second segment), although this is not a requirement, and they may have the same areas as each other.

The semiconductor structure may be a GaN layer, and may for example include InGaN. The semiconductor structure may emit light of any wavelength, e.g., visible light, e.g., blue light. The first and second segments may emit light of the same color as each other.

Figure 8:
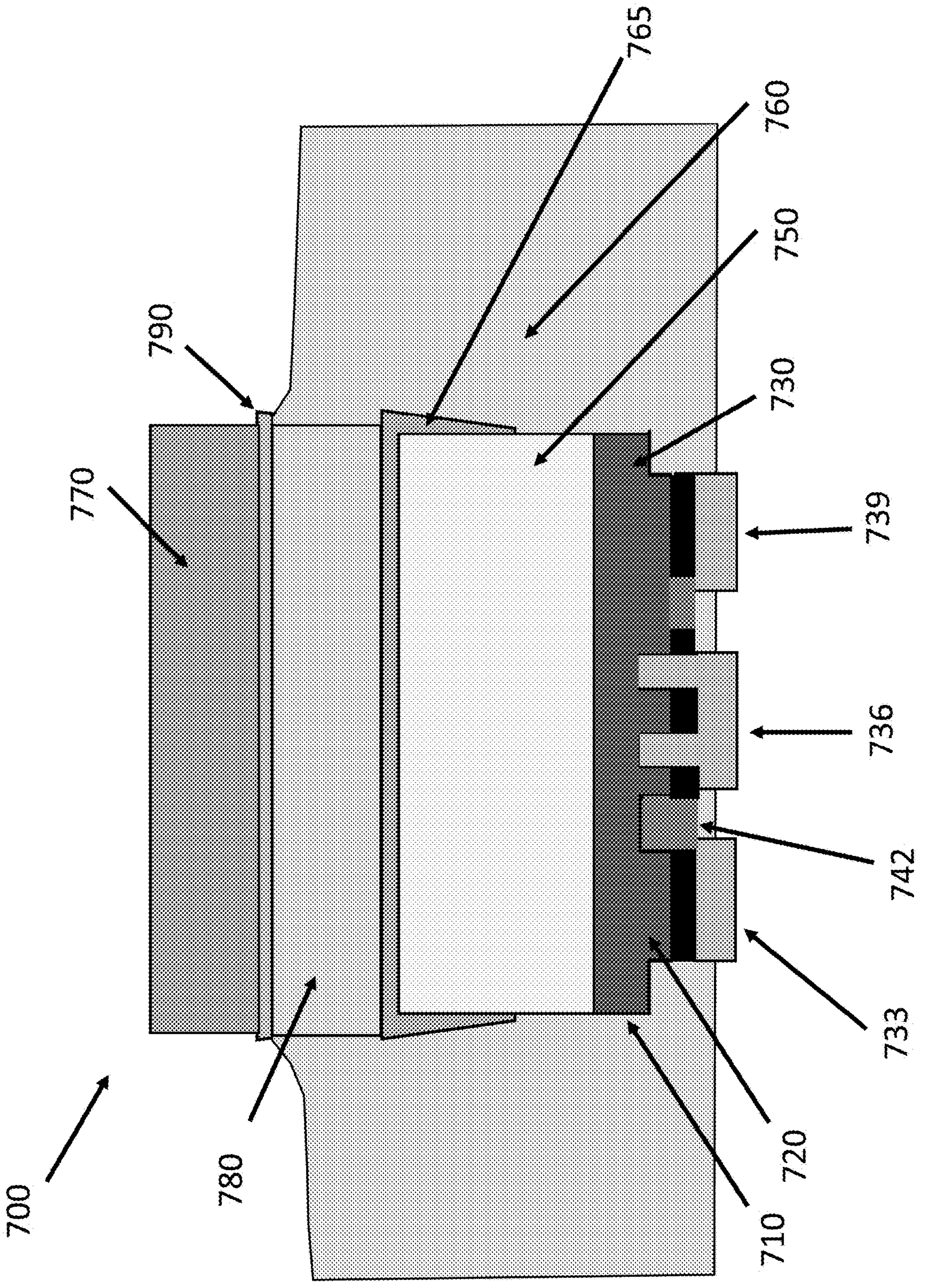
FIG. 8 shows a cross section of an LED package with a segmented semiconductor structure and two wavelength converters on a stack.
Figure 9A:
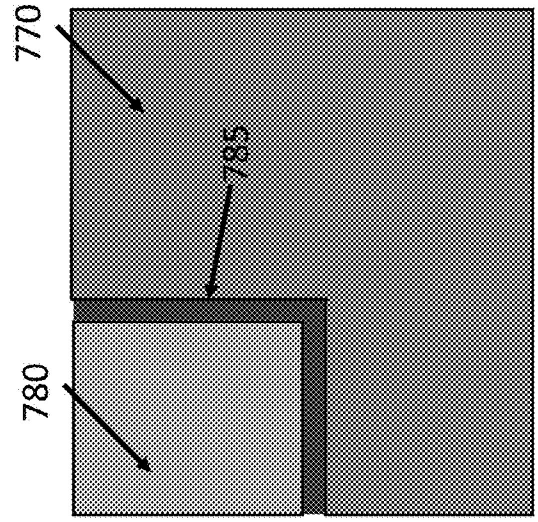
FIG. 9*a*-9*d* shows a plan view of two wavelength converter structures coupled together and the respective sizes and shapes of their areas.
Figure 9B:
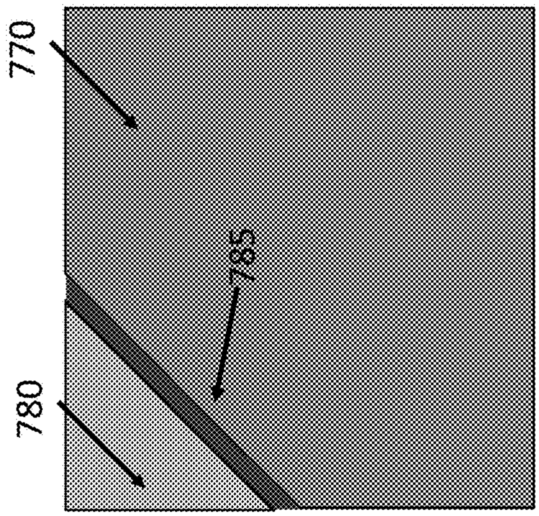
Figure 9C:
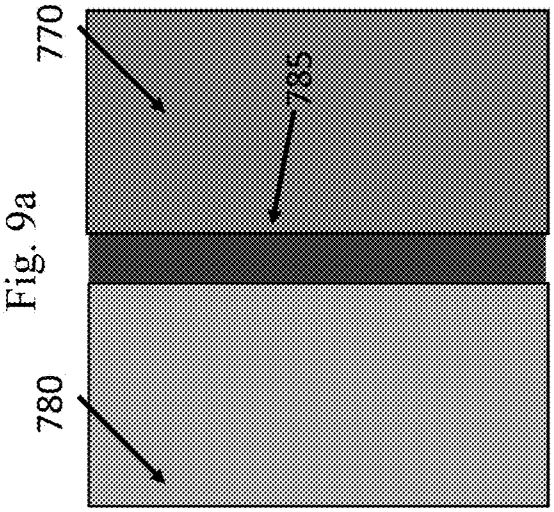
Figure 9D:
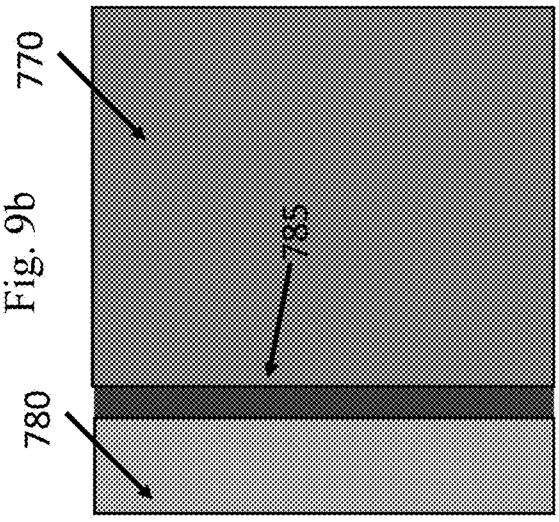

The region separating the first segment from the second segment may be a trench 742. The trench may extend through the entire semiconductor structure, i.e., through the nGaN layer and the pGaN layer of the semiconductor structure. Alternatively, the trench may extend only through the pGaN layer of the semiconductor structure without extending through the nGaN layer, as shown in FIG. 8. The trench may be filled with an insulating material to prevent direct electrical contact of the first segment with the second segment. Alternatively or additionally, the sidewalls of the trench may be coated with a reflective material, such as distributed bragg reflector (DBR) 745, which helps optically isolate the first and second segment from each other to prevent crosstalk of light between the two emitting areas. The DBR may be a dielectric layer stack alternating between low and high RI dielectric layers This DBR stack may be optimized to reflect the color of light emitted by the semiconductor structure, e.g., blue light, and may be in direct contact with one or both of the first and second segment.

The trench is illustrated with perpendicular sidewalls. Alternatively sidewalls of the trench may be etched with a draft angle, i.e. a non-perpendicular slope, to provide more forward directed emissions. For example, the trench may be narrower as it gets closer towards the substrate due to a draft angle of the sidewalls.

The LED package may include a side coat 760 on the side walls of the substrate and the semiconductor structure that is reflective.

Vertically above the substrate are the converter layers for the LED package. The LED packages may include at least two converter layers that are coupled together, for example an IR converter layer 780 and a visible color converter layer 770. Each of these converter layers may be or include phosphors, for example, ceramic phosphor platelets. One advantage of using separate converters for IR and visible light, e.g., ceramic platelet converters for each, is that platelets can be pick and place and sintered separately to maximize the total yield. They may have different areas from each other, as shown in FIG. 9. The IR converter layer and the visible converter layer may be each be designed to operate with, respectively, the first and second segment over which they are disposed over. For example, the IR converter layer may be disposed over the light path of the first segment such that when the first segment is in operation the IR converter layer absorbs light from the first segment (e.g. blue light) and converts at least part of it to infrared (e.g., non-visible) or near-infrared light (e.g. the IR converter emits light with wavelength from 700-1100 nm). For example, the visible convert layer may be disposed over the light path of the second segment such that when the second segment is in operation the visible converter layer absorbs at least some of the light from the first segment and converts it to visible light of a different color than the emitted light, such as yellow light.

The converter layers may have areas corresponding to the areas of the first and second segment. For example, the IR converter layer may have an area matching or substantially matching that of the first segment, and the same may be true of the visible converter layer with the second segment. The IR converter layer may not overlap with the second segment, and the visible converter layer may not overlap with the first segment, although this is not a requirement. Furthermore, even if the areas do not match exactly in absolute dimensions with the corresponding segments in the semiconductor structure, the ratio of the area of the IR converter layer to the visible converter layer may match or substantially match the ratio of the area of the first segment to that of the second segment. Some example areas of the converter layers are shown in FIGS. 9*a*-9*d*, which depicts the areas in proportion. In the above and below descriptions and illustrations, the IR converter layer and the visible converter layer may be swapped with each other unless otherwise stated; this is true as well with regards to any reference to the first and second segment (as merely one example, the visible color convert layer may be the smaller areas depicted in FIGS. 9*a*-*d*, while the IR converter layer is the larger area).

The IR converter layer may be coupled to the visible color layer, by, for example, a converter side coat 785. This converter side coat may fill a gap of several tens of microns, e.g. 40-100 microns, e.g. 50-70 microns. This converter side coat may be reflective for light emitted by the semiconductor structure and/or the converter layers (e.g. visible light and infrared light) which will increase contrast significantly.

The IR converter layer may be a ceramic platelet and may be made of out of any of the following material systems, as examples: Cr(III) doped garnet phosphors such as, for example, $Gd_{3-x}RE_xSc_{2-y-z}Ln_yGa_{3-w}Al_wO_{12}{:}Cr_z$ (Ln=Lu, Y, Yb, Tm; RE=La, Nd), where $0 \le x \le 3$; $0 \le y \le 1.5$; $0 \le z \le 0.3$; and $0 \leq w \leq 2$ such as $Gd_{2.8}La_{0.2}Sc_{1.7}Lu_{0.2}Ga_3O_{12}:Cr_{0.1}$ or $Gd_{2.66}Yb_{0.2}Sc_{1.75}Lu_{0.3}Ga_2AlO_{12}:Cr_{0.1}$ Alternatively or additionally, the IR converter layer may contain a main phase of lithium scandium magnesium silicate doped with chromium (LSMSO). For example, the NIR phosphor ceramic may include Cr(III) doped pyroxenes such as: $E_{1-w}Sc_{1-x-y-u-w}M_yZ_uA_{2w}Si_{2-z-u}Ge_zAl_uO_6:Cr_x$, such as $Li_{1-w}Sc_{1-x-w}Mg_{2w}Si_2O_6:Cr_x$ ($0.1 \leq w \leq 0.4$).

Alternatively or additionally, the IR converter layer may contain borates phases like ScBO3:Cr. For example, the NIR phosphor ceramic may include Cr(III) doped borate phosphor phases such as: $Sc_{1-x-y}A_yBO_3:Cr_x$ (A=Lu, In, Yb, Tm, Y, Ga, Al; $0<x \leq 0.5$, $0<y \leq 0.9$).

Alternatively or additionally, the IR phosphor ceramics may contain spinel phases: $AE_{1-x-z}A_{z+0.5(x-y)}D_{2+0.5(x-y)-z-u}E_zO_4:Ni_y,Cr_u$ where AE=Mg, Zn, Co, or Be, or mixtures thereof, A=Li, Na, Cu, or Ag, or mixtures thereof, D=Ga, Al, B, In, or Sc, or mixtures thereof, and E=Si, Ge, Sn, Ti, Zr, or Hf, or mixtures thereof; where $0 \leq x \leq 1$, $0<y \leq 0.1$, $0 \leq z \leq 1$, $0 \leq u \leq 0.2$, such as $Li_{0.5-0.5x}(Ga,Sc)_{2.5-0.5x-y}O_4:Ni_x,Cr_y$ (where $0 \leq x \leq 1$, $0<y \leq 0.1$).

The visible color converter layer may include materials such as: $Y_{3-x-y}RE_yAl_{5-y}Ga_zO_{12}:Ce_x$ (RE=Gd, Lu, Yb), where $0<x \leq 0.1$; $0 \leq y \leq 0.5$; $0 \leq z \leq 0.3$.

Alternatively or additionally, the visible color convert layer may include: $R_{3-x-y-z+w2}A_{1.5x+y-w2}Si_{6-w1-w2}Al_{W1+w2}O_{y+w1}N_{11-y-w1}:Ce$, (R=La, Gd, Lu, Y and Sc, A=Ba, Sr, Ca, Mg and Zn), where $(1/7) \leq (3-x-y-z+w2)/6<(1/2)$, $0<(1.5x+y-w2)/6<(9/2)$, $0<x<3$, $0 \leq y \leq 2$, $0<z<1$, $0 \leq w1 \leq 5$, $0 \leq w2 \leq 5$, and $0 \leq w1+w2 \leq 5$.) such as $(La_{0.8}Y_{0.2})_{3-z}Si_6N_{11}:Ce_z$.

The IR converter layer may further comprise a filter element on top of its light emitting surface to absorb or reflect visible light. The filter element may by a colored glass longpass filter or a dichroic filter.

Figure 10:
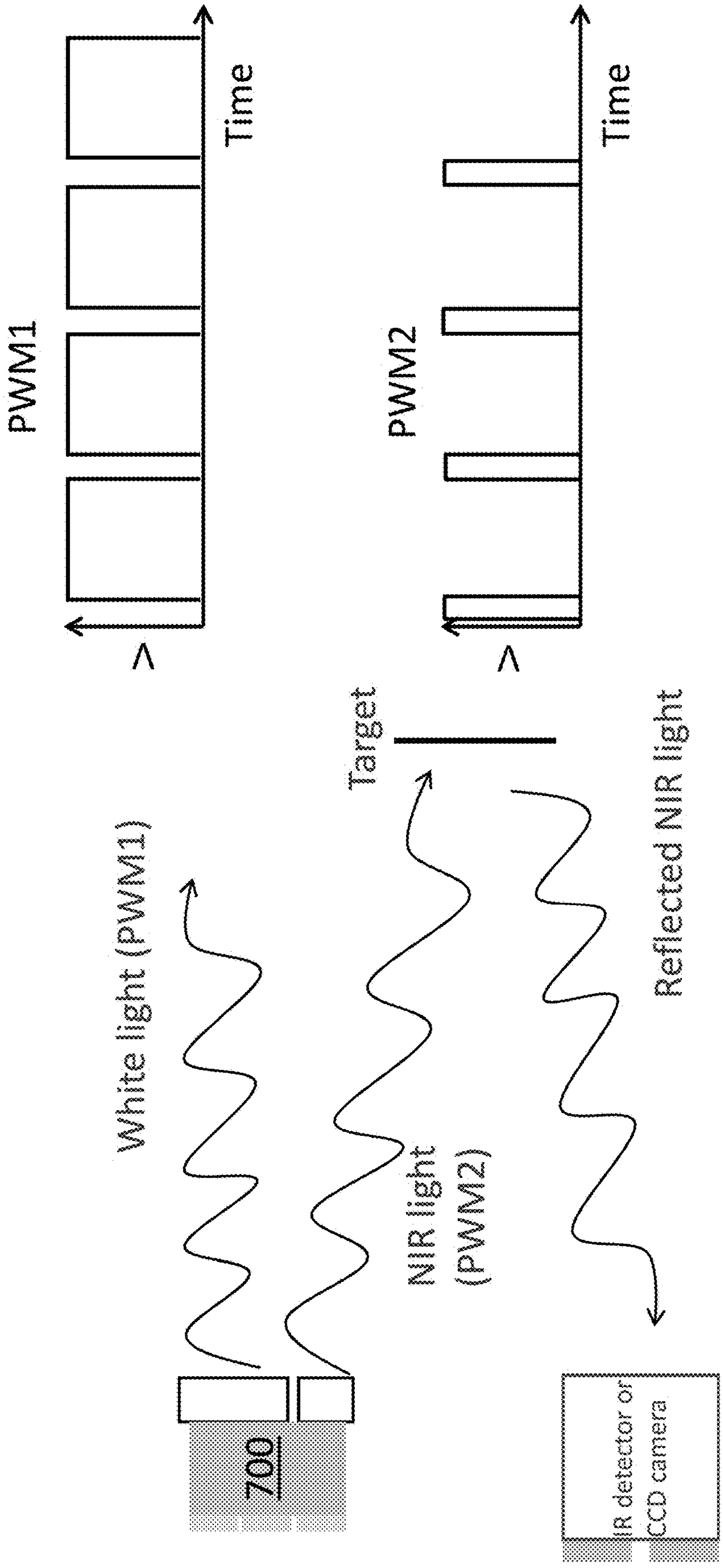
FIG. 10 shows diagram of the pulse width modulated NIR and white light emissions of an LED package, the NIR light emission being detected by a detector or camera.

With two different anode contact pads and one common cathode according to embodiments of the invention, it will be possible to drive the IR emitter and visible color emitter (e.g. first and second segments of the semiconductor structure) independently. For example, a different PWM signal could be applied sequentially to IR emitter and visible color emitter to minimize cross talk. For example, the IR emitter could be switched on only during the time that visible color emitter is switched off. Alternatively, the IR emitter and visible color emitter could be operated at different current density where power conversion efficacy (PCE) is minimal. An example of sequential electronic driving between white and IR emitter is described in FIG. 10. For reducing IR noise and reducing needs for IR signal post-treatment, IR light can be emitted with PWM signal complementary to PWM signal of emitted visible light.

An optic (e.g. a molded silicone optic) may be disposed over the light path of the LED package. The optic may include two different micro-lenses pattern on top of the full platelet area to deviate IR light and visible color light differently from each other.

While chip scale package (CSP) architecture is depicted as an example, thin-film flip-chip (TFFC) architecture and vertical-injection thin-film (VTF) die (where electrical contact is made with wire on top of the die and other electrical contact with conductive glue or paste, e.g., Ag epoxy, full area on the bottom of the die) can also be used to build the architecture according to embodiments of the invention. For a VTF die, the top contact electrode may be shifted outside the light emitting area (side) to be able to glue the platelets.

Although two converter layers 780 and 770 are shown in FIG. 7 to correspond to two segments of the semiconductor structure 710, more than two converter layers and/or more than two segments of the semiconductor structure may be present. For example, the semiconductor structure 710 may be segmented into three segments all coupled to a same surface of the substrate 750, and three converter layers respectively aligned with and corresponding to these segments may be disposed on the opposite side of the substrate from the semiconductor structure. The more than two segments may be spaced apart from each other by respective trenches to not be in direct physical contact, while the converter layers may also be spaced apart from each other to not be in direct physical contact, and may have side coats of reflective material between them.

FIG. 8 shows an LED package according to embodiments of the invention. Here the visible color converter layer 770 is disposed over the IR converter layer 780 rather than side by side. The visible color converter layer may be attached to the IR converter layer by second adhesive layer 790. In this case, the visible color converter layer may be a same or substantially a same size as the IR converter layer, although this is not a requirement. In any case, the converter layers overlap with each other, and their combined area from a top-down view may be larger than a total area of the semiconductor structure. The IR converter layer may be centered on the substrate 750 (e.g., the center of its area from a top-down view matches a center of the area of the substrate from a top-down view); alternatively, the IR converter layer may be off-center from the substrate so that their centers are not aligned from a top-down view. The length of the IR converter layer may be longer than that of the substrate (as shown in FIG. 8), or it may be shorter, or the same.

FIG. 11 shows an example method of fabricating a LED package according to embodiments of the invention, as expressed in different top-down views of different layers of the LED package.

Figure 11A:
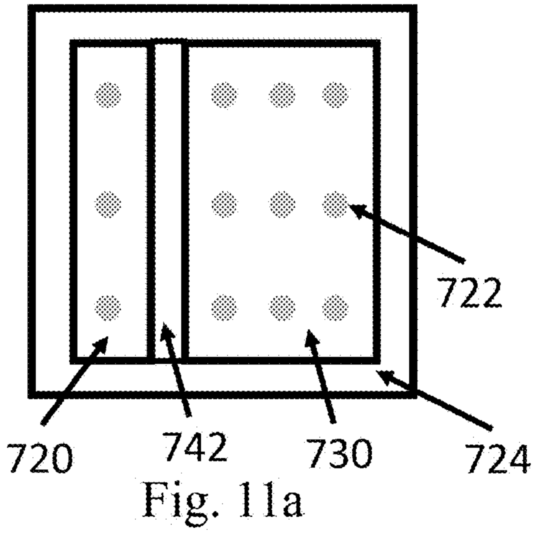
FIGS. 11*a*-*e* shows a plan view of different layers of an LED package with a segmented semiconductor structure and two anodes connected to the segments, as well as a common cathode.

In a first step, provide a semiconductor structure having a semiconductor structure 710 that may emit light, e.g., a GaN layer, which is etched so that two segments of the semiconductor structure are physically separated form each other. For example, the first segment 720 and the second segment 730 in the semiconductor structure corresponding to, respectively, IR and white light emissions, will be physically separated from each other by a trench 742. In parallel, p-mesa etching will be done to obtain nVias 722 and n-contact areas 724 on die edge. The p-mesa etching on the outer rim is common for the IR and white emitter area. This is shown in FIG. 11*a*.

In a second step, one or more of a transparent conductive oxide (e.g., ITO), eVias, mirror and guard sheet may be deposited or formed on the GaN layer.

Figure 11B:
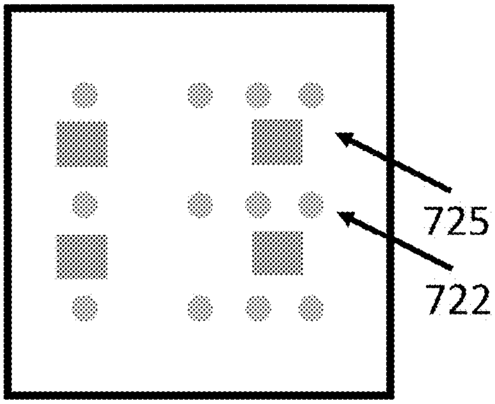

In a third step, dielectric layers are deposited to insulate the edges of both the first and second segments (also called "emitters"). The dielectric layers have several openings 725 on each emitter allowing electrical contact between p-GaN/dielectric/mirror area and following layers. This is shown in FIG. 11*b*.

Figure 11C:
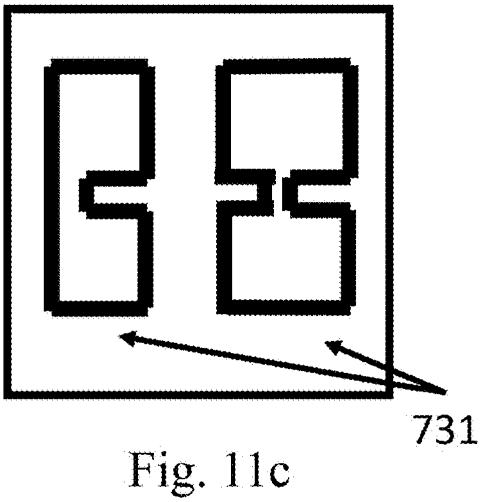
Figure 11D:
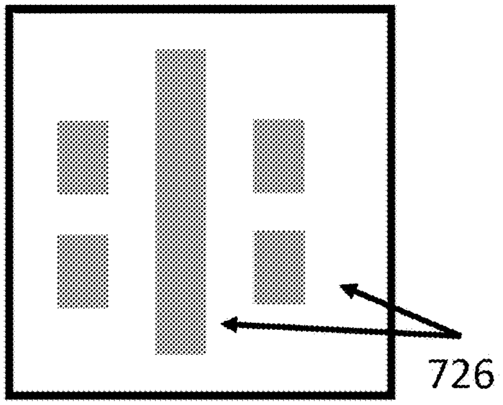

In a fourth step, bonding layers 731 are disposed on the semiconductor structure, to connect to the two anodes for the first and second segment as well as the common cathode, described in more detail below. This is shown in FIG. 11*c*.

In a fifth step, second dielectric layers are deposited and patterned to have second openings 726 allowing contact to the corresponding electrical pads described in the next step.

Figure 11E:
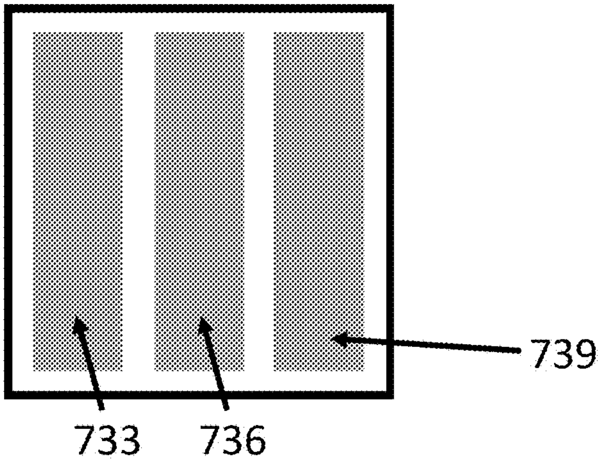

In a sixth step, electrical pads serving as the anode 733 for the first segment, the anode 739 for the second segment, and the common cathode 736 are disposed in the package, as illustrated in FIG. 11*e*. These pads may be or comprise metal. Since the first and second segment have their own individual anodes, they may be individually addressable. This allows the LED package to advantageously emit light from segments corresponding to, e.g., white and IR areas, separately from each other.

In a seventh step, two different phosphor structures are coupled together, e.g., glued to each other and/or glued to the substrate 750.

The disclosures provided in this specification are intended to illustrate but not necessarily to limit the described implementation. As used herein, the term "implementation" means an implementation that serves to illustrate by way of embodiments but not limitation. The techniques described in the preceding text and figures can be mixed and matched as circumstances demand to produce alternative implementations. It will be apparent to those of ordinary skill in the art that numerous variations, changes, and substitutions of the embodiments described above can be made without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. All such alternatives will be apparent to one skilled in the art in light of this disclosure and are intended to fall within the scope of the appended claims.

What is claimed is:

1. A light emitting device, comprising:

a semiconductor structure comprising an n-doped layer, a p-doped layer, and active layer, the semiconductor structure comprising:

a first segment configured to emit light of a first wavelength;

a second segment configured to emit light of the first wavelength; and a trench adjacent to the first and second segment spacing apart the first and second segment from each other, the trench extending through the n-doped layer, the p-doped layer, and the active layer;

a first wavelength converter arranged in the light path of the first segment and configured to absorb light of the first wavelength emitted by the first segment and emit light of a second wavelength different from the first wavelength;

a second wavelength converter arranged in the light path of the second segment and configured to absorb light of the first wavelength emitted by the second segment and emit light of a third wavelength different from the first and second wavelength; and a substrate disposed between the first wavelength converter and the semiconductor structure.

2. The light emitting device of claim 1, wherein the first segment and second segment are individually addressable with respect to each other.

3. The light emitting device of claim 1, wherein the light of the second wavelength is infrared and/or near infrared.

4. The light emitting device of claim 1, wherein the light of the third wavelength is visible light.

5. The light emitting device of claim 1, wherein the light of the first wavelength is visible light.

6. The light emitting device of claim 1, wherein the first and second wavelength converters are ceramic phosphors.

7. The light emitting device of claim 1, wherein the first wavelength converter comprises chromium.

8. The light emitting device of claim 1, wherein the first and second wavelength converters have differently sized areas from each other.

9. The light emitting device of claim 8, wherein the first wavelength converter has a smaller area than that of the second wavelength converter.

10. The light emitting device of claim 9, wherein the first segment has a smaller area than that of the second segment.

11. The light emitting device of claim 1, wherein the first wavelength converter does not overlap with the second segment in a vertical direction and the second wavelength converter does not overlap with the first segment in the vertical direction.

12. The light emitting device of claim 1, wherein the first wavelength converter is disposed adjacent to the second wavelength converter.

13. The light emitting device of claim 12, further comprising a reflector between the first wavelength converter and the second wavelength converter.

14. The light emitting device of claim 1, wherein the first wavelength converter is disposed to overlap the second wavelength converter in a vertical direction.

15. The light emitting device of claim 1, wherein the trench is filled with an insulating material.

16. The light emitting device of claim 1, further comprising a distributed bragg reflector (DBR) disposed in the trench.

17. The light emitting device of claim 1, wherein the substrate is disposed between the second wavelength converter and the semiconductor structure.

18. The light emitting device of claim 1, wherein:

the semiconductor structure comprises a plurality of segments comprising the first and second segment, the plurality of segments comprising more than two segments spaced apart from each other; and the light emitting device comprises a plurality of wavelength converters comprising the first and second wavelength converter, the plurality of wavelength converters comprising more than two wavelength converters spaced apart from each other.

19. The light emitting device of claim 1, further comprising a first anode electrically connected to the first segment, a second anode electrically connected to the second segment, and a common cathode electrically connected to the first and second segment.

20. A method of producing a light emitting device, comprising:

providing a semiconductor structure comprising an n-doped layer, a p-doped layer, and active layer, the semiconductor structure disposed on a substrate;

segmenting the semiconductor structure to produce a first segment and a second segment spaced apart from the first segment by a trench, the first and second segment configured to emit light of a first wavelength, the second segment individually addressable with respect to the first segment, the trench extending through the n-doped layer, the p-doped layer, and the active layer;

coupling the first and second segments to a first wavelength converter and a second wavelength converter, the first wavelength converter configured to absorb light of the first wavelength and emit light of an infrared and/or near infrared wavelength, the second wavelength converter configured to absorb light of the first wavelength and emit light of a visible wavelength, the substrate disposed between the first wavelength converter and the semiconductor structure;

contacting the first segment with a first anode and the second segment with a second anode.

* * * * *